United States Patent

Gay

[15] 3,700,921

[45] Oct. 24, 1972

[54] CONTROLLED HYSTERESIS TRIGGER CIRCUIT

[72] Inventor: Michael J. Gay, Scottsdale, Ariz.

[73] Assignee: Motorola, Inc., Franklin Park, Ill.

[22] Filed: June 3, 1971

[21] Appl. No.: 149,482

[52] U.S. Cl.....................307/235, 307/288, 330/30 D

[51] Int. Cl...............................H03k 5/20, H03f 3/68

[58] Field of Search......307/235, 290, 288; 330/30 D

[56] References Cited

UNITED STATES PATENTS 3,416,004 12/1968 Taylor ....................307/290 X 3,487,323 12/1969 Schaefer.................307/235 X 3,600,607 8/1971 Vatin......................307/290 X

*Primary Examiner*—John Zazworsky

*Attorney*—Mueller & Aichele

[57] ABSTRACT

A monolithic integrated trigger circuit has its upper switching threshold determined by different emitter area ratios of a differential amplifier supplied from a first current source, and its lower switching threshold determined by the ratio of the current supplied by the first current source with the ratio of current supplied by a second current source rendered operative by a regenerative switch coupled with the output of the differential amplifier.

9 Claims, 2 Drawing Figures

INVENTOR
MICHAEL J. GAY
BY
Mueller & Aichele
ATTYS

CONTROLLED HYSTERESIS TRIGGER CIRCUIT

BACKGROUND OF THE INVENTION

A number of applications exist for a trigger or squaring circuit having a built-in predictable hysteresis, in which the circuit switches from a first state to a second state at one level and switches back again from the second state to the first state at a second level depending upon the hysteresis characteristics built into the circuit. Some applications for circuits of this type are in FM stereo multiplex receivers for effecting muting of the stereo processing channel during monaural broadcasts or muting of stereo broadcast signals that are too weak to provide satisfactory operation of the receiver. In such applications, it is necessary that the switch-on and switch-off levels of the trigger circuit be accurately controlled and that the hysteresis of the switching action be predictable and consistent in the operating environment of the circuit.

In addition to the foregoing, it is desirable to provide a trigger circuit which readily lends itself to integrated circuit applications; so that such a trigger circuit may be formed independently or as an integral part of a larger integrated circuit system.

SUMMARY OF THE INVENTION

Therefore, it is an object of this invention to provide an improved trigger circuit.

It is an additional object of this invention to provide a trigger circuit having a predictable hysteresis of operation.

It is another object of this invention to provide a trigger circuit having upper and lower thresholds of operation in which one of the thresholds is established as the basis upon which the other threshold is dependent to define a predetermined hysteresis of operation.

It is a further object of this invention to provide a monolithic integrated trigger circuit having a predetermined hysteresis of operation, with one of the switching thresholds being established by an offset created by different emitter areas of two transistors in a differential amplifier circuit.

It is still another object of this invention to provide a trigger circuit having a predetermined hysteresis of operation in which the hysteresis is controlled at least in part by the ratio between a pair of current sources.

In accordance with a preferred embodiment of this invention a pair of transistors are interconnected as a differential amplifier and are provided with current from a first current source. The two outputs of the differential amplifier are coupled through a control circuit to a regenerative switch which is switched from a first state of conduction to a second state of conduction in response to the conductivity of the transistors in the differential amplifier attaining a predetermined relationship. The regenerative switch then remains in its second state of conduction under the control of a second current source which is rendered operative by the regenerative switch attaining the second state of conduction. A change of state of conduction of the regenerative switch from its second state to its first state then is effected by a second predetermined ratio of conduction of the two transistors in the differential amplifier, at a switching level determined by the ratio of currents supplied by the two current sources.

DETAILED DESCRIPTION

Figure 1:
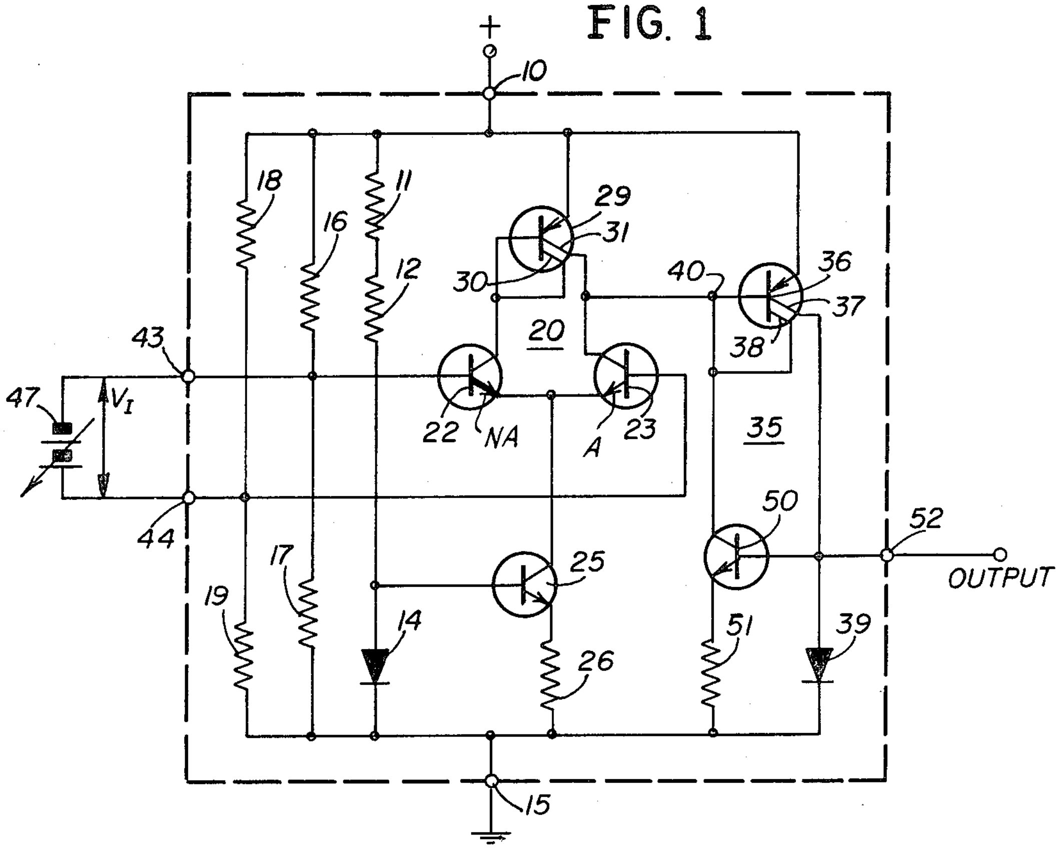
FIG. 1 is a circuit diagram of a preferred embodiment of the invention.

Referring now to FIG. 1, there is shown, enclosed in dotted lines, a monolithic integrated trigger circuit in accordance with a preferred embodiment of the invention. Operating potential for the circuit is supplied from a source of B+ (not shown) connected to a bonding pad 10 on the trigger circuit. This operating potential is applied through three voltage dividers, the first of which includes a pair of resistors 11 and 12 connected in series with a diode 14 to a grounded bonding pad 15. A second of these voltage dividers includes two resistors 16 and 17 connected in series between the bonding pads 10 and 15, and the third voltage divider includes a pair of resistors 18 and 19 connected in series between the bonding pads 10 and 15. In these latter two voltage dividers, the resistors 16 and 18 are selected to be of equal value as are the resistors 17 and 19.

The trigger circuit has an input stage in the form of a differential amplifier 20 including a pair of NPN transistors 22 and 23. The emitters of the transistors 22 and 23 are connected together and are supplied with current from an NPN current source transistor 25, the base of which is connected to the junction between the resistor 12 and the diode 14, and the emitter of which is connected through an emitter resistor 26 to the bonding pad 15. The diode 14 provides a relatively stable operating potential for the base of the transistor 25 and further provides temperature compensation for the base-emitter junction of the transistor 25. Thus, the current drawn by the transistor 25 and supplied to the differential amplifier 20 is a relatively constant current over a range of variations of the B+ supply potential and over a range of ambient temperature variations. This current is divided between the two transistors 22 and 23 in accordance with the relative conductivities of these transistors.

The quiescent operating level for the transistors 22 and 23 is obtained for the transistor 22 from the junction between the resistors 16 and 17, which is connected to the base of the transistor 22, and for the transistor 23 from the junction between the resistors 18 and 19, which is connected to the base of the transistor 23. Since the resistors 16 and 18 are equal in value and the resistors 17 and 19 are equal in value, the biasing potentials applied to the bases of the transistors 22 and 23, in the absence of any differential input signal, are therefore equal.

The transistors 22 and 23, however, are fabricated with the emitter area (NA, where N is a positive number greater than 1) of the transistor 22 being greater than the emitter area A of the transistor 23. This is indicated in FIG. 1 by showing the emitter of the transistor 22 substantially heavier or larger than the emitter of the transistor 23. Because of this unequal emitter area, the transistor 22 conducts more collector current than the transistor 23 for an equal potential applied to the bases of the transistors 22 and 23. This is the circuit condition of operation with no differential input voltage applied to the bases of the transistors 22 and 23.

The relative conductivities of the transistors 22 and 23, as reflected in the collector currents drawn by these transistors, are sensed by a control circuit in the form of a dual-collector lateral PNP transistor 29, having a pair of collectors 30 and 31. The emitter of the transistor 29 is connected to the B+ bonding pad 10 and the collector 30 is connected in common with the base of the transistor 29 to the collector of the transistor 22. This causes a diode to be connected in series between the bonding pad 10 and the collector of the transistor 22. The collector 31 of the transistor 29 is connected to the collector of the transistor 23, so that the conductivity of the transistor 29 is controlled by the conductivity of the transistor 22 to cause equal currents to flow in both of the collectors 30 and 31, provided they are of the same area. The magnitude of the current in the collectors 30 and 31 varies in accordance with the conductivity of the transistor 22.

A second part of the trigger circuit is a positive feedback circuit portion or regenerative switch 35 including a second dual-collector lateral PNP control transistor 36, having first and second collectors 37 and 38. The collector 38 of the transistor 36 is connected to its base at a junction 40, and the junction 40 also is connected to the junction between the collector 31 of the transistor 29 and the collector of the transistor 23. Thus, the coupling of the collector 38 to the junction 40 effectively places a diode in series between the bonding pad 10 and the junction 40.

Assume that the transistor 36 is nonconductive and that the potentials applied to the bases of the transistors 22 and 23 are such that the transistor 22 draws more current than the transistor 23. The total current, as stated previously, drawn by the transistors 22 and 23 is determined by the current source 25 and is supplied from the collectors 30 and 31 of the transistor 29 to the collectors of the transistors 22 and 23, respectively. The biasing of the transistor 29, however, is obtained from the collector of the transistor 22, and the transistor 29 attempts to provide equal current from each of the collectors 30 and 31. The amount of this current is equal to the current flowing through the collector of the transistor 22.

If the transistor 22 is more conductive than the transistor 23, the collector of the transistor 23 does not draw as much current as the collector of the transistor 22. As a consequence, an excess current is available at the collector of the transistor 31. This current applied to the junction 40 as a reverse current at the base of the transistor 36 and causes the transistor 36 to be held in a nonconductive state of operation. In this condition, the transistor 29 saturates.

If a differential voltage is applied between the bases of the transistors 22 and 23 on a pair of input bonding pads 43 and 44, respectively, the relative conductivities of the transistors 22 and 23 may be changed. Such an input is illustrated in FIG. 1 as being obtained from a source indicated as a variable battery 47 connected across the bonding pads 43 and 44. Assume that the potential applied from the source 47 is increased in the direction shown causing the potential on the bonding pad 44 to be made increasingly positive with respect to the potential on the bonding pad 43. When this occurs, the transistor 22 is rendered less conductive and the transistor 23 is rendered more conductive until the built-in offset which is created by the different emitter areas of the transistors 22 and 23 is overcome and the collector currents in the transistors 22 and 23 become equal. At this point, the transistor 23 draws all of the current supplied by the collector 31 of the transistor 29, so that reverse current no longer is applied to the base of the PNP transistor 36.

The regenerative positive feedback circuit 35 then switches on because the transistor 36 is rendered conductive and current flows from the collector 37 through a diode 39 to the grounded bonding pad 15. The potential on the anode of the diode 39 is applied as an operating potential to the base of an NPN current source transistor 50, the emitter of which is connected through a resistor 51 to the grounded bonding pad 15. The collector of the current source transistor 50 is connected to the junction 40; so that once the current source transistor 50 is rendered conductive by current flowing through the transistor 36, it maintains the transistor 36 conductive by means of the current drawn thereby through the collector 38. The conduction of the regenerative switch 35 then is independent of the state of conduction of the differential amplifier 20.

If the relative conductivities of the differential amplifier transistors 22 and 23 continue to change in a direction further to increase the conductivity of the transistor 23 over the conductivity of the transistor 22, the current drawn by the collector of the transistor 23 in excess of that supplied by the collector 31 is supplied from the bonding pad 10 through the transistor diode formed by the interconnection of the collector 38 of the transistor 36 with its base at the junction 40. Thus, the current drawn by the regenerative switch transistor 36 is divided between the current supplied through the current source transistor 50 and the current required by the transistor 23 in excess of that supplied by the transistor 29.

Figure 2:
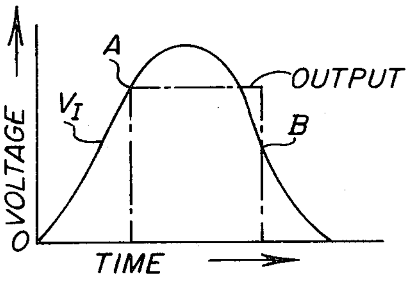
FIG. 2 shows waveforms useful in describing the operation of the circuit shown in FIG. 1.

In FIG. 2 the initial switching point A of the regenerative switch 35 from a state of nonconduction to a state of conduction is indicated on the waveform VI, which is indicative of the differential voltage appearing across the bonding pads 43 and 44. The output waveform on a bonding pad 52 connected to the junction of the collector 37 with the diode 39 then rises from a low level to one 0 (0.7 volts), the voltage drop across the diode 39, as indicated in the "output" waveform of FIG. 2. Although the output voltage in FIG. 2 is indicated as rising to a magnitude which is equal to the magnitude of the voltage VI which causes the change of state of the trigger circuit, the magnitude of the output voltage is determined by the parameters of the diode 39 and is not determined by the magnitude of the differential input voltage which causes the switching of the circuit. The output voltage could be either greater than or less than the magnitude of the voltage VI which causes the change of state of the circuit. The relative magnitudes of the output voltage and the voltage VI shown in FIG. 2 merely have been chosen for ease of illustration. A more convenient form of output (a current output) may be obtained by connecting the base-emitter path of an NPN transistor across the diode 39, with the collector of this transistor providing the output current.

Now if the differential voltage between the terminals 43 and 44 commences to be reduced to thereby cause the conductivity of the transistor 22 to increase and the conductivity of the transistor 23 to decrease, the falling portion of the waveform VI shown in FIG. 2 occurs. When the magnitude of the differential input voltage VI, however, reaches the magnitude at point A shown in FIG. 2, the regenerative switch 35, does not switch back to its original nonconductive state. This is due to the fact that the current source 50 commences drawing the excess current (over that demanded by the collector of the transistor 23) from the collector 31 of the transistor 29. There is a corresponding reduction in the current pulled by the current source transistor 50 from the collector 38 of the transistor 36, but the transistor 36 remains conductive.

The currents drawn by the current sources 25 and 50 are chosen so that the current source 25 draws a sufficient current relative to that drawn by the current source 50 to cause the trigger circuit 35 to regeneratively cease conduction. As the conductivity of the transistor 23 continues to be reduced, more and more current is supplied by the collector 31 of the transistor 29 to junction 40 and is pulled from the junction 40 through the current source transistor 50. When the conductivity of the transistor 23 is reduced to the point that the excess current supplied from the collector of the transistor 31 equals a determinable fraction (typically in the vicinity of one-half) of the current then drawn by the current source 50, the regenerative switch 35 enters an unstable state and its conduction regeneratively reduces to zero. The magnitude of the differential input voltage VI which causes this to happen is indicated at point B in FIG. 2, and it should be noted that the magnitude of VI at point B is less than the magnitude of VI at point A which rendered the regenerative switch 35 conductive.

Once the transistor 36 is rendered nonconductive, the current source 50 also is rendered nonconductive in the regenerative switching off of the circuit 35. The reverse current applied to the base of the transistor 36 maintains the switch 35 in this state of operation until once again the differential input voltage VI reaches a magnitude indicated at point A in FIG. 2.

From the foregoing, it is apparent that the upper threshold or trigger point (point A in FIG. 2) is determined by the built-in offset voltage established by the different emitter areas of the transistors 22 and 23, and that the lower threshold for returning the switch to its original state of operation is dependent on the ratio of the currents supplied by the current sources 25 and 50 to the junction 40. This lower threshold ratio defines the absolute hysteresis of the trigger circuit, that is, the difference between the upper and lower switching thresholds. The lower threshold is not defined independently of the upper threshold but is determined relative to the upper threshold, so that a very low hysteresis may be obtained from the circuit, if desired. Adjustment of the ratio of currents drawn by the current sources 25 and 50 thereby establishes the hysteresis of the circuit based on an upper threshold determined by the offset built into the emitters of the differential amplifier transistors 22 and 23.

Other degrees of freedom in defining the upper threshold and the hysteresis voltage are possible by varying the relative areas of the collectors 30 and 31 of the transistor 29 or the collectors 37 and 38 of the transistor 36, since to do so would change the relative currents supplied from the collectors of these transistors from the equal currents in the foregoing description to currents having a different ratio. The basic operation of the circuit, however, would be the same as that which has been described. The circuit is capable of operation at very low differential input voltages, typical circuits operating in the range of 20 to 40 millivolts.

Although the transistors 29 and 36 have been shown as dual collector lateral PNP transistors, each of these transistors could be replaced with a pair of single collector lateral PNP transistors. The transistors of each of such pairs would have common base and emitter connections corresponding to the base and emitter connections of the transistors 29 and 36 shown in FIG. 1. The separate collectors of the transistors in such pairs would correspond directly to the pairs of collectors of each of the transistors 29 and 36.

I claim:

1. A trigger circuit having a predetermined hysteresis of operation including in combination:

- first and second transistors of the same conductivity type, each having collector, emitter and base electrodes;
- first and second voltage supply terminals for connection across a source of DC potential;
- first current source means coupled between said second voltage supply terminal and the emitters of said first and second transistors;
- means for applying a differential input voltage to the bases of said first and second transistors;
- first control means coupled with the collector of said first transistor for supplying current to the collector of said second transistor, with said current having a predetermined relationship with the current drawn by the collector of said first transistor;
- regenerative switch means having first and second states of conduction coupled in circuit between said first and second voltage supply terminals and having a control input coupled with the collector of said second transistor, said regenerative switch means in its first state of conduction being held in said first state by a current comprising the excess of the current supplied by said first control means over the current drawn by the collector of said second transistor, said regenerative switch means being switched from its first to its second conductive state responsive to said second transistor drawing collector current substantially equal to or in excess of the current supplied by said first control means;
- second current source means in said regenerative switch means coupled with said control input, and rendered operative with said regenerative switch means in its second conductive state for maintaining said regenerative switch means in said second state responsive to current through said second current source means; and
- said regenerative switch means being switched from its second to its first conductive state in response to current supplied by said first control means in excess of the current drawn by the collector of said second transistor and also equal to a predetermined fraction of the current supplied by said second current source.

2. The combination according to claim 1 further including circuit means for causing said first transistor to be rendered more conductive than said second transistor with said differential input voltage being zero.

3. The combination according to claim 2 wherein said trigger circuit is formed as a monolithic integrated circuit and said circuit means comprises the emitter of said first transistor having a greater area than the emitter of said second transistor.

4. The combination according to claim 1 wherein said first control means includes first diode means connected between said first voltage supply terminal and the collector of said first transistor and further includes a third transistor having at least base, emitter, and collector electrodes and being of opposite conductivity type to the conductivity type of said first and second transistors, with the base of said third transistor being coupled with the collector of said first transistor, the emitter thereof being coupled with said first supply terminal, and the collector thereof being connected with the collector of said second transistor and the control input of said regenerative switch means.

5. The combination according to claim 4 wherein said regenerative switch means includes second diode means coupled between said first voltage supply terminal and the collector of said second transistor and a fourth transistor of the same conductivity type as the third transistor having collector, emitter and base electrodes, with the base electrode thereof comprising the control input of said regenerative switch means, the emitter electrode thereof being coupled with the first voltage supply terminal, and the collector electrode thereof being connected in a circuit for supplying an operating bias potential to said second current source, said second current source being coupled between said second voltage supply terminal and the junction of the collector of said second transistor with the control input of said regenerative switch means.

6. A trigger circuit having a predetermined hysteresis of operation including in combination:

first and second transistors of a first conductivity type interconnected in a differential circuit and each having collector, emitter and base electrodes with the emitter electrodes thereof being coupled together at a first junction;

first and second voltage supply terminals for connection across a source of DC operating potential;

first current source means including a third transistor of said first conductivity type and having collector, emitter and base electrodes, the emitter being coupled with said second voltage supply terminal and the collector being coupled with said junction;

means for applying a bias potential to the base of said third transistor;

means for applying a differential input voltage to the bases of said first and second transistors;

first diode means coupled between said first voltage supply terminal and the collector of said first transistor;

fourth transistor means of a second conductivity type and having at least collector, emitter and base electrodes, with the emitter thereof coupled with said first voltage supply terminal, the base thereof coupled with the collector of said first transistor and the collector thereof coupled with the collector of said second transistor at a second junction;

second diode means coupled between said first voltage supply terminal and said second junction;

second current source means including a fifth transistor of said first conductivity type and having collector, emitter, and base electrodes, the emitter being coupled with said second voltage supply terminal and the collector being coupled with said second junction, said second current source means being rendered operative in response to a control signal applied to the base of said fifth transistor; and a sixth transistor of said second conductivity type and having at least collector, emitter, and base electrodes with the base thereof coupled with said second junction, the emitter thereof coupled with said first voltage supply terminal and the collector thereof coupled in circuit with the base of said fifth transistor for applying said control signal thereto with said sixth transistor rendered conductive.

7. The combination according to claim 6 wherein said trigger circuit is formed as a monolithic integrated circuit, and the emitter area of said first transistor exceeds the emitter area of said second transistor to cause said first transistor to draw more current than said second transistor with said differential input voltage being zero.

8. The combination according to claim 7 wherein said first, second, third and fifth transistors are NPN transistors said fourth and sixth transistors are lateral PNP transistors.

9. The combination according to claim 8 wherein said first diode means and said fourth transistor are formed from a single dual-collector lateral PNP transistor having first and second collectors, with said first collector thereof being coupled with the base thereof and the collector of said first transistor, and the second collector thereof being coupled with the collector of said second transistor at said second junction, and said second diode means and said sixth transistor are formed from a second dual-collector lateral PNP transistor, having first and second collectors, with the first collector thereof being coupled with said second junction and the second collector thereof being coupled in said circuit with the base of said fifth transistor.

* * * * *